(12) United States Patent
Lindhorst et al.

(10) Patent No.: US 7,724,570 B1
(45) Date of Patent: *May 25, 2010

(54) ADAPTIVE PROGRAMMING OF MEMORY CIRCUIT INCLUDING WRITING DATA IN CELLS OF A MEMORY CIRCUIT

(75) Inventors: Chad A. Lindhorst, Seattle, WA (US); Todd E. Humes, Shoreline, WA (US); Alex May, Seattle, WA (US); Agustinus Sutandi, Issaquah, WA (US)

(73) Assignee: Virage Logic Corporation, Fremont, CA (US)

( * ) Notice: Subject to any disclaimer, the term of this patent is extended or adjusted under 35 U.S.C. 154(b) by 152 days.

This patent is subject to a terminal disclaimer.

(21) Appl. No.: 11/982,277

(22) Filed: Oct. 31, 2007

Related U.S. Application Data

(60) Provisional application No. 60/932,662, filed on May 31, 2007.

(51) Int. Cl.
*G11C 14/00* (2006.01)

(52) U.S. Cl. .......................... 365/185.08; 365/210.11; 365/211

(58) Field of Classification Search ............ 365/185.08, 365/210.11, 211
See application file for complete search history.

(56) References Cited

U.S. PATENT DOCUMENTS

| 5,430,674 A * | 7/1995 | Javanifard ................. 365/185.1 |
| 5,944,837 A * | 8/1999 | Talreja et al. ............... 713/600 |
| 2004/0086073 A1 * | 5/2004 | Wuidart et al. ................. 377/2 |

* cited by examiner

*Primary Examiner*—Hoai V Ho
(74) *Attorney, Agent, or Firm*—Nixon & Peabody LLP; David B. Ritchie

(57) ABSTRACT

Adaptive programming methods and supportive device architecture for memory devices are provided. Methods include partitioning words into variable length segments. More particularly, methods include receiving a word of data, parsing the word into a plurality of write-subsets, where the size of the write-subsets depends on values of the data and constraints that are specific to the memory circuit, and writing the data in cells of the memory circuit, one write-subset at a time. A memory device includes a digital controller capable of parsing words into a plurality of write-subsets, where the length of write-subsets are depending on values of the data and constraints that are specific to the memory device.

20 Claims, 10 Drawing Sheets

DEVICE WITH MEMORY CIRCUIT

*DEVICE WITH MEMORY CIRCUIT*

| WORD TO WRITE | 1011 0001 0000 1101 0001 1100 0100 1010 010 | | | | |
|---|---|---|---|---|---|
| WRITE-SUBSET 1 | 1011 0001 | | | | |
| WRITE-SUBSET 2 | | 0000 1101 | | | |
| WRITE-SUBSET 3 | | | 0001 1100 | | |
| WRITE-SUBSET 4 | | | | 0100 1010 | |
| WRITE-SUBSET 5 | | | | | 010 |

*FIXED LENGTH SEGMENTATION*

*ADAPTIVE PROGRAMMING METHODS*

*CONFIGURATION RECORD OF A MEMORY CIRCUIT*

*DETERMINE WRITE CONSTRAINTS*

ADAPTIVE PROGRAMMING METHODS
OF MEMORY CIRCUIT

*EXTRACTING A WRITE-SUBSET FROM A WRITE WORD*

| WORD TO WRITE | 1011 0001 0000 1101 0001 1100 0100 1010 010 |
|---|---|
| WRITE-SUBSET 1 | 101 |
| WRITE-SUBSET 2 |    1 0001 |
| WRITE-SUBSET 3 |          0000 11 |
| WRITE-SUBSET 4 |                 01 0001 |
| WRITE-SUBSET 5 |                         11 |
| WRITE-SUBSET 6 |                             00 0100 1 |
| WRITE-SUBSET 7 |                                   010 010 |

*VARIABLE LENGTH SEGMENTATION FOR N=2*

FIG. 9A

| WORD TO WRITE | 1011 0001 0000 1101 0001 1100 0100 1010 010 |
|---|---|
| WRITE-SUBSET 1 | 1011 0001 0000 1101 0001 |
| WRITE-SUBSET 2 |                         1100 0100 1010 010 |

*VARIABLE LENGTH SEGMENTATION FOR N=8*

FIG. 9B

| WORD TO WRITE | 1011 0001 0000 1101 0001 1100 0100 1010 010 |
|---|---|
| SEGMENT 1 | 1.11 ...1 .... 11.1 ...1 |
| SEGMENT 2 |                         11.. .1.. 1.1. .1. |

*BITS TO BE WRITTEN SEGMENTS BY SEGMENTS*

FIG. 9C

| | |
|---|---|
| WORD TO WRITE | 1011 0001 0000 1101 0001 1100 0100 1010 010 |
| WRITE-SUBSET 1 | 1011 0001 0000 1101 0001 1 |
| WRITE-SUBSET 2 | 10. 000. .100 0100 1010 010 |
| WRITE-SUBSET 3 | 10 |

SEQ. CONSTRAINED BITS — VOLTAGE CONSTRAINED BIT
BITS INCLUDED IN PREVIOUS SUBSET

*VARIABLE LENGTH SEGMENTATION FOR N=8, WITH SEQUENCE AND VOLTAGE CONSTRAINTS*

FIG. 11A

| | |
|---|---|
| WORD TO WRITE | 1011 0001 0000 1101 0001 1100 0100 1010 010 |
| SEGMENT 1 | 1.11 ...1 .... 1..1....1 1 |
| SEGMENT 2 | 1.... ....1.. .1.. 1.1. . |
| SEGMENT 3 | 1. |

*BITS TO BE WRITTEN SEGMENTS BY SEGMENTS*

FIG. 11B

ADAPTIVE PROGRAMMING OF MEMORY CIRCUIT INCLUDING WRITING DATA IN CELLS OF A MEMORY CIRCUIT

CROSS REFERENCE TO RELATED APPLICATIONS

This application claims the benefit of U.S. Provisional Patent Application No. 60/932,662, filed on May 31, 2007, entitled "NVM Variable Length Programming", the disclosure of which is hereby incorporated by reference for all purposes.

The present application may be considered to be related to co-pending U.S. patent application Ser. No. 11/982,278, in the name of inventors Chad A. Lindhorst, Todd E. Humes, Alex May and Agustinus Sutandi.

FIELD OF THE INVENTION

The present invention relates generally to nonvolatile memory (NVM) devices. More particularly, the present invention relates to methods for programming single-poly pFET-based NVM devices.

BACKGROUND

Memory devices are electronic devices arranged to store electrical signals. A plurality of memory elements can be combined in various arrangements in order to store multiple bits arranged in words or other combinations. Various electronic circuits including semiconductor devices such as transistors are used as memory elements.

Memory elements may be classified in two main categories: volatile and nonvolatile. Volatile memory loses any data as soon as the system is turned off. Thus, it requires constant power to remain viable. Most types of random access memories (RAM) fall into this category. Non-volatile memory does not lose its data when the system or device is turned off.

Demand for embedded nonvolatile memory (NVM) in integrated circuits has grown steadily over the past decade. Desirable characteristics of embedded NVM include low cost, low power, high speed, and high reliability (data retention and program/erase cycling endurance). NVM may be embedded in various integrated circuit (IC) technologies such as, for example, the widely used Complementary Metal Oxide Semiconductor (CMOS) technology. Some embedded NVM in CMOS applications include, for example, storing: chip serial numbers, configuration information in Application Specific Integrated Circuits (ASICs), product data, security information and/or serial numbers in radio frequency identification integrated circuits, program code, and data in embedded microcontrollers, analog trim information, and the like.

Programming time for embedded NVM devices may be long when a whole row (or word) cannot be programmed at the same time due to some constraints. In such a case, the programming method partitions the word into fixed length word segments, and performs the programming, segment by segment. This disclosure addresses this shortcoming of prior art by introducing word segmentation methods that take into consideration existing and changing programming constraints.

BRIEF SUMMARY

The invention improves over the prior art by introducing adaptive programming methods and a supportive device architecture for memory devices.

Methods include partitioning words into variable length segments. More particularly, methods can include receiving a word of data, parsing the word into a plurality of write-subsets, where the size of the write-subsets depends on values of the data and constraints that are specific to the memory circuit, and writing the data in cells of the memory circuit, one write-subset at a time.

A memory device according to an embodiment includes a digital controller capable of parsing words into a plurality of write-subsets, where the length of the write-subsets depends on values of the data and constraints that are specific to the memory device.

These and other features and advantages of the invention will be better understood from the specification of the invention, which includes the following Detailed Description and accompanying Drawings.

BRIEF DESCRIPTION OF THE DRAWINGS

The following Detailed Description proceeds with reference to the accompanying Drawings, in which:

FIG. 9A is a table showing a variable length segmentation of the write word of FIG. 3 according to an embodiment of the present disclosure.

FIG. 9B is a table showing another variable length segmentation of the write word of FIG. 3 according to another embodiment of the present disclosure.

FIG. 9C is a table showing actual bits of data that are written in the memory circuit using segmentation per FIG. 9B according to an embodiment of the present disclosure.

FIG. 11A is a table showing sample variable length segmentation of the write word of FIG. 3 according to yet another embodiment of the present disclosure.

FIG. 11B is a table showing actual bits of data that are written in the memory circuit using segmentation per FIG. 11A according to an embodiment of the present disclosure.

DETAILED DESCRIPTION

Figure 1:
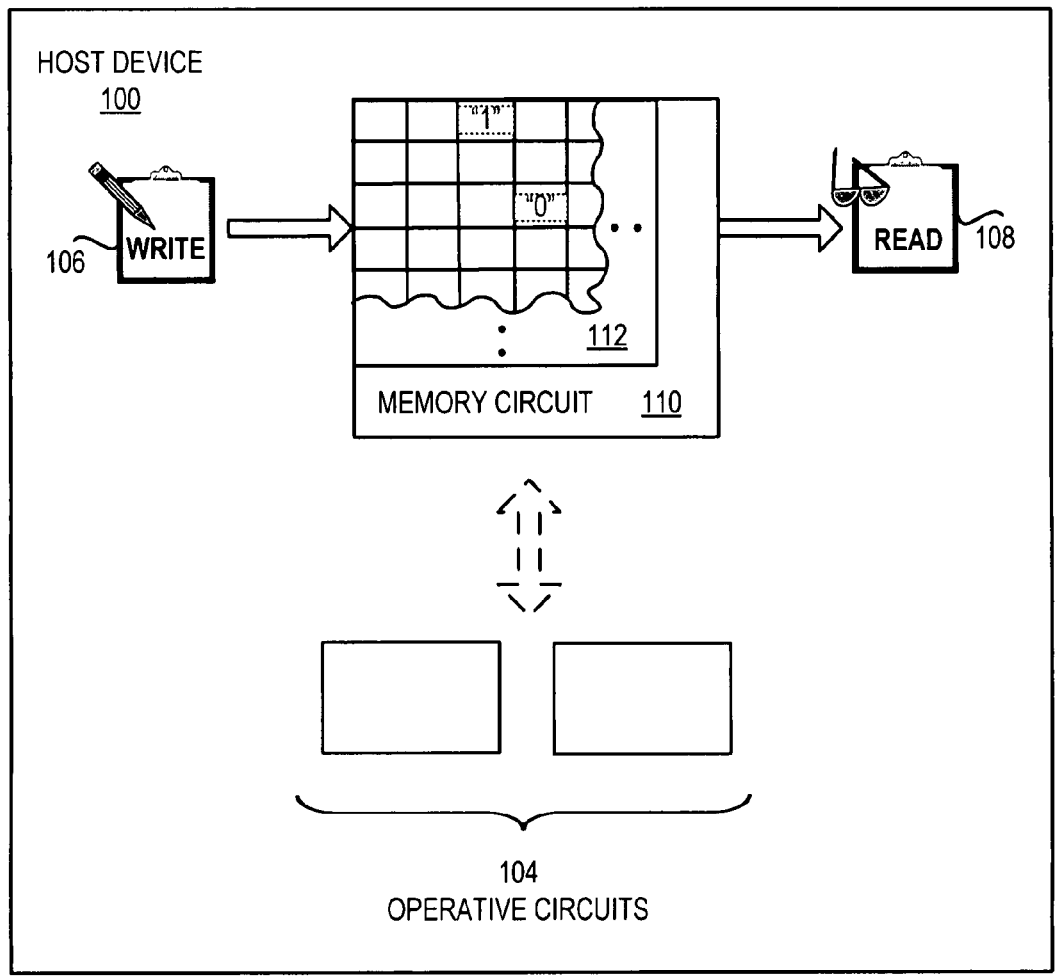
FIG. 1 is a block diagram of a host device having a memory circuit according to embodiments of the present disclosure, for storing data to be used by other components of the host device.

The present invention is now described. While it is disclosed in a presently preferred form, the specific embodiments of the disclosure as disclosed herein and illustrated in the drawings are not to be considered in a limiting sense. Rather, these embodiments are provided so that this disclosure will be thorough and complete, and will fully convey the scope of the disclosure to those skilled in the art. Indeed, it should be readily apparent in view of the present description that the disclosure might be modified in numerous ways. Among other things, the present invention may be embodied as devices, methods, software, and so on. Accordingly, the present invention may take the form of an entirely hardware embodiment, an entirely software embodiment or an embodiment combining software and hardware aspects. This description is, therefore, not to be taken in a limiting sense.

As has been mentioned, the present disclosure provides circuit, and methods for adaptive programming of memory circuits. The invention is now described in more detail.

FIG. 1 is a block diagram of a host device having a memory circuit according to embodiments, for storing data to be used by other components of the host device. Host device 100 includes NVM memory circuit 110 that is adapted to interact with other circuits 104. Individual cells of NVM memory 110 are adapted to store information as a result of "write" operation 106 and provide the stored information as a result of "read" operation 108. The information is stored even during a power-off state of device 100.

"Read" operation 108, which provides the stored information to one or more of the other circuits 104 may occur during a transition from the power-off state to a power-on state for some parts of NVM memory circuit 110. For other parts of NVM memory circuit 110, "read" operation 108 may occur during the power-on state upon being addressed by another circuit (e.g. a controller).

As a result, different circuits of device 100 may receive data for their operation at different states of powering the device. For example, an oscillator circuit may be providing calibration data during the transition from the power-off state from one part of NVM memory circuit 110, while a digital signal processor circuit may be provided for programming data after the transition.

Figure 2A:
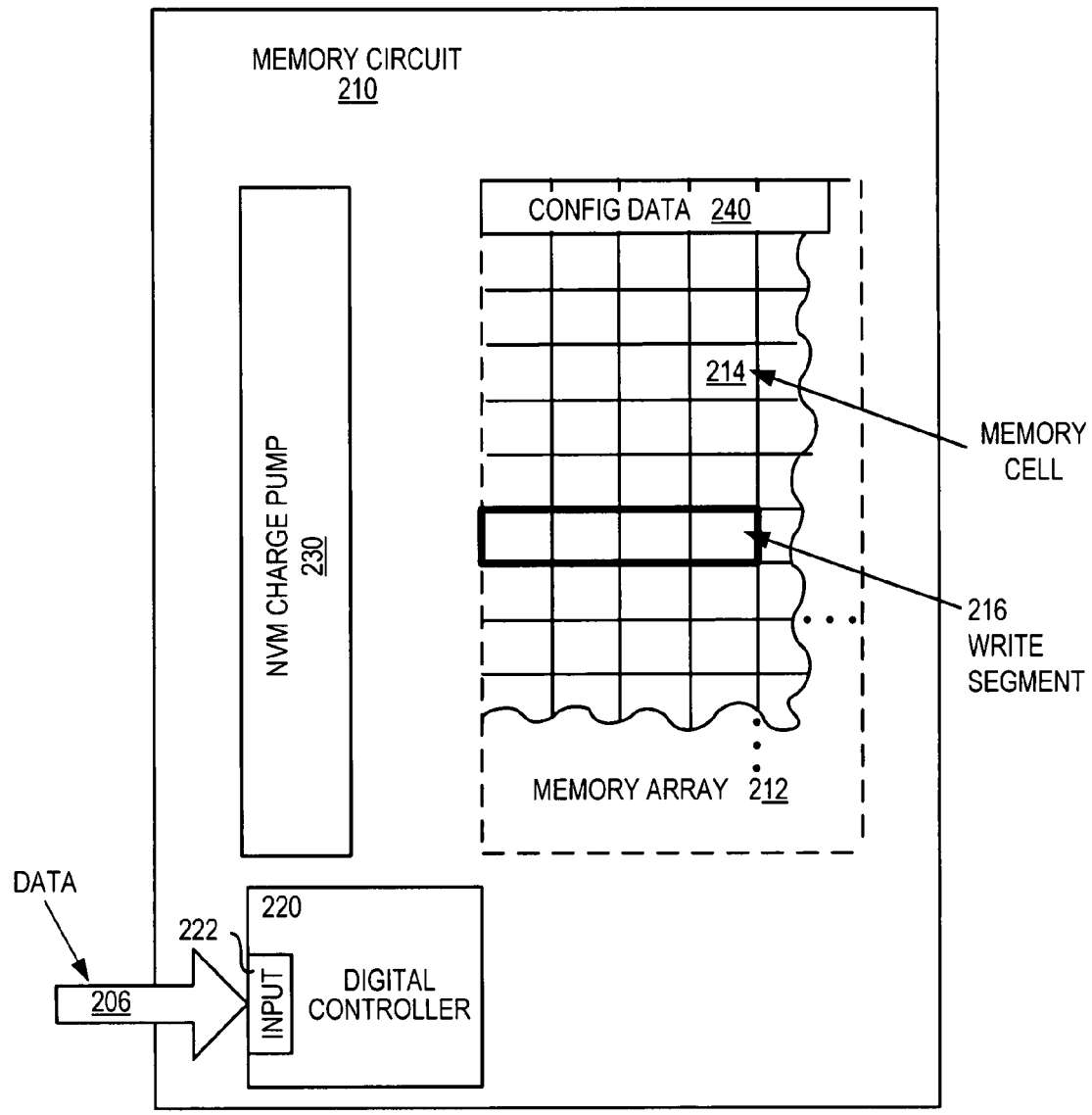
FIG. 2A is a block diagram illustrating an implementation of the memory circuit of FIG. 1 according to an embodiment of the present disclosure.

FIG. 2A is a block diagram of a possible implementation of the memory circuit FIG. 1. Memory circuit 210 provides features that make it well suited for adaptive programming. Memory circuit 210A includes memory array 212, digital controller 220, and charge pump circuit block 230. Memory array 212 commonly comprises a number of cells e.g. cells 214, which store the data to be consumed by operational components. Memory array 212 may be implemented in the form of an NVM array comprising cells that are addressable in terms of a row and a column. In some embodiments, the NVM memory cell may be constructed using floating-gate pFET transistors. Memory cells 214 store electrical charges that can represent digital data. An un-programmed memory cell has digital datum of "0", due to this fact, bits of "0"s need to be stored. To store a "1" charges are stored in a floating gate, this operation requires energy from the charge pump.

Digital controller 220 is arranged to provide the necessary data processing and control signal manipulation capability for write and read operations. It addresses individual cells of memory array 212 during write (e.g. program) and read operation. It also manages the operation of charge pump 230 and high voltage switches (not shown) required for write/read operations. Input port 222 of digital controller 220 receives words of input data 206 to be stored. During a write operation, digital controller 200 parses an incoming write word into a plurality of write-subsets. Detailed description of the subset generation is discussed below in relation of FIG. 4.

Charge pump 230 is an electronic circuit that uses capacitors as energy storage elements to convert low voltages into higher voltage outputs. Charge pump 230 is an essential component of memory circuit 210 since it provides high voltages for the write operation. Due to design constraint, the size of the charge pump generally is kept small. An undersized charge pump cannot provide the necessary current needed to program a whole row (a whole word). This limitation of the charge pump is made worse by high operating temperature. Due to limitation introduced by the charge pump a write word is segmented into write-subsets. The maximum length of the write-subset is determined by the drive capability of the charge pump.

In some applications a set of memory device specific data, i.e. configuration data 240 is stored in memory array 212.

Figure 2B:
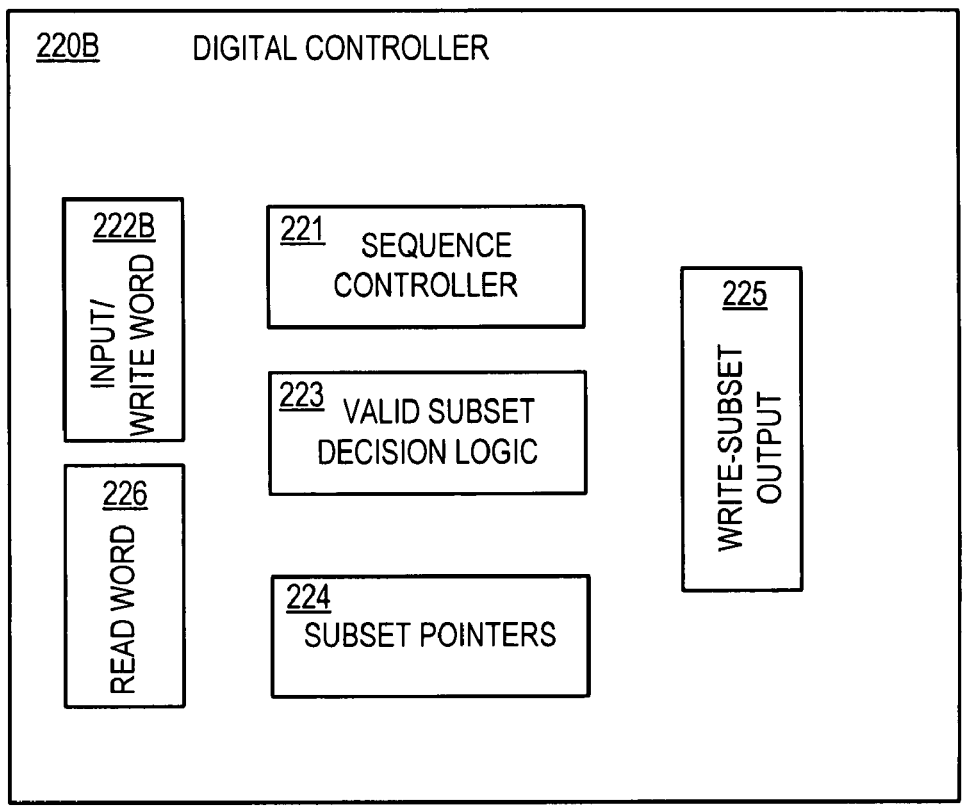
FIG. 2B is a block diagram illustrating an implementation of a digital controller of FIG. 2A according to an embodiment of the present disclosure.

FIG. 2B is a block diagram illustrating an exemplary implementation of the digital controller of FIG. 2A according to embodiments of the present disclosure. Digital controller 220B includes circuit blocks e.g. sequence controller 221, valid subset decision logic 223, subset pointer 224 and data like write word 222B, read word 226, write-subset output 225.

The digital controller 220 may compare the existing word stored in the memory i.e. "read word" 226 to the desired word in the memory i.e. "write word" 222B. Sequence controller 221 (a state machine or a processor) controls the overall sequence of events for reading from the memory, performing the iterative steps of the algorithm to extract a write-subset, writing the subset, then repeating the process for the next subset. The final subset to be written i.e. "write-subset output" 225 may be stored in a register, or may be a selection of part of the "write word" 222B or a combination of parts of the "write word" 222B and parts of the "read word" 226, indexed by subset pointers 224.

At various stages of the algorithm, valid subset decision logic 223 determines whether a bit or a collection of bits currently under consideration would, or would not, constitute a valid subset based on the system's defined requirements for a valid subset.

Figures 3, 4:
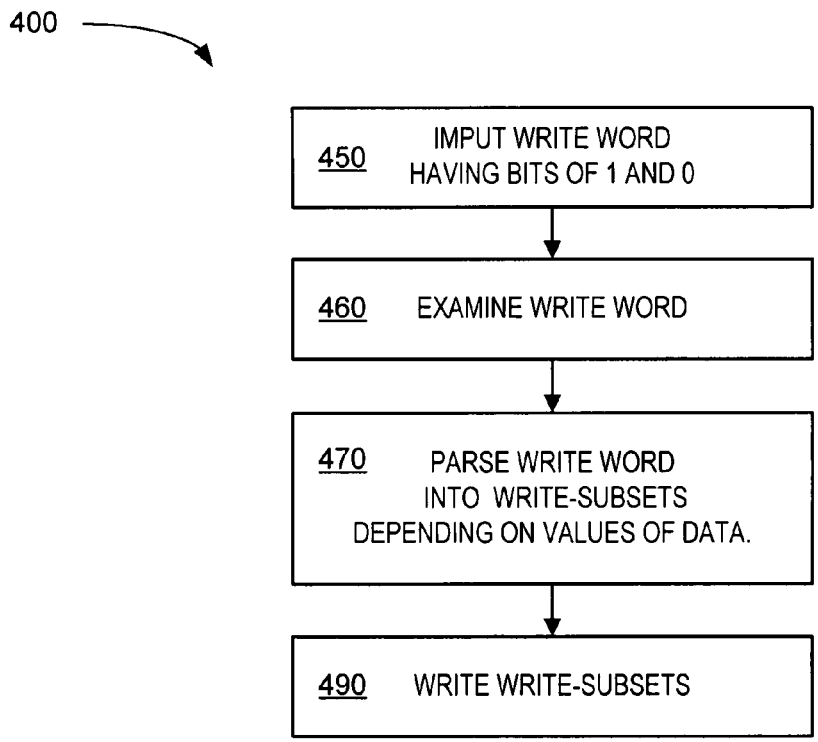
FIG. 3 is a table showing a fixed length segmentation of write word of the memory circuit according to the prior art.
FIG. 4 is a flowchart illustrating a top-level view of adaptive programming methods of the memory circuit according to embodiments of the present disclosure.

FIG. 3 is a table showing a fixed length segmentation of write word of the memory circuit 210. Fixed length segmentation partitions an incoming word into predetermined length write-subset. The simplest way to partition a word is to break it down to single bits and do the programming in a bit by bit basis. This method works all the time but it also takes the longest programming time. A more effective segmentation, as is shown in FIG. 3 partitions a word into fixed length write-subsets, in the given example the length is 8 bits regardless of the data. This method does not take advantage of the fact that only logic "1"s need to be programmed.

FIG. 4 is a flowchart illustrating a top-level view of adaptive programming methods of the memory circuit according to embodiments of the present disclosure. The goal of the methods is to program a memory using the fewest number of programming cycles. Method 400 starts at action 450. In action 450, write word 260 is received by digital controller 220. In action 46, write word is examined for it contents (e.g. the number of logic "1" it contains). In action 470, write word parsed into write-subsets, where the write-subset length depends on values of data. In action 490, the generated write-subset is written in the memory. It should be noted that the words write and program are used interchangeably in this document when they refer to a memory cell.

Figure 5:
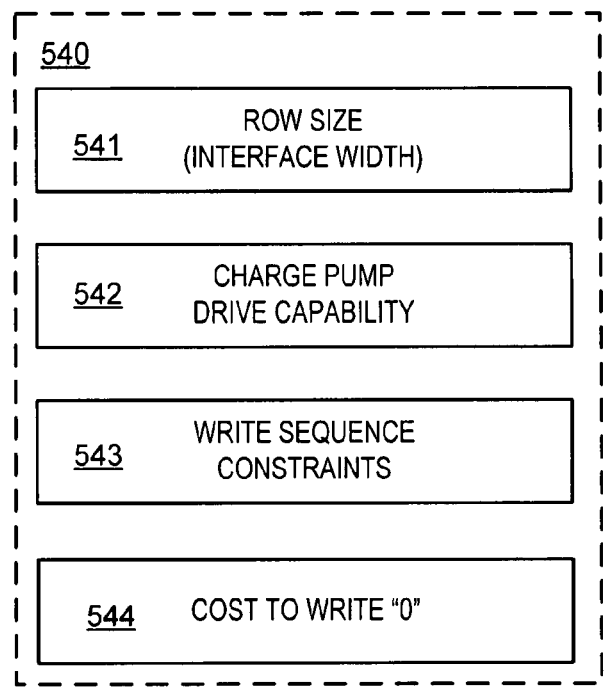
FIG. 5 is a block diagram showing components of (stored) configuration data of a memory circuit according to an embodiment of the present disclosure.

FIG. 5 is a block diagram showing some possible components of configuration record 540 stored as configuration data 240 in memory circuit of FIG. 2. Configuration record 540 contains information used for assuring proper operation, and programming of memory circuit of FIG. 2A. Configuration record may include information i.e. row size (interface width) 54, charge pump drive capability 542, write sequence constraints 543, cost to write "0" 544 and the like. It should be noted the provided list in not a complete list of the stored configuration data.

Figure 6:
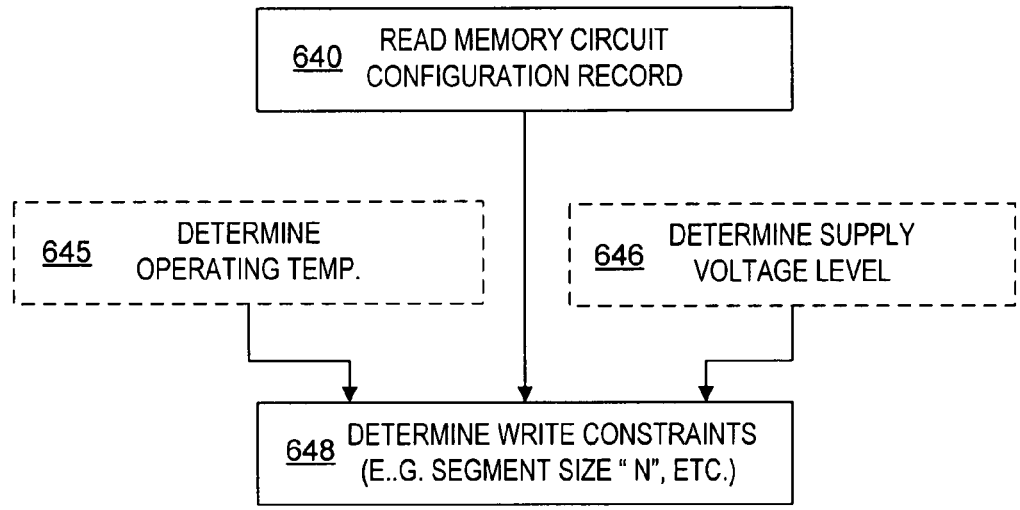
FIG. 6 is a diagram illustrating how write constraints (e.g. a segment size "N", etc.) are determined according to embodiments of the present disclosure.

FIG. 6 is a block diagram 638. Diagram 638 illustrates data sources and environmental factors used to determine write constraints (e.g. a segment size "n", etc.). The principal way to obtain write constraint is reading the configuration record at block 640.

Optionally, operating temperature is determined at block 645. Charge pump performance deteriorates at high temperature due to leakage currents; as a result, charge pump drive capability is de-rated. Optionally, supply voltage levels are determined at block 646, since available voltage level can also modify charge pump drive capability. After collecting above mentioned information, in block 648, segment size N is determined. Where integer N represents the number of logic "1", that can be written at the same time.

Figure 7:
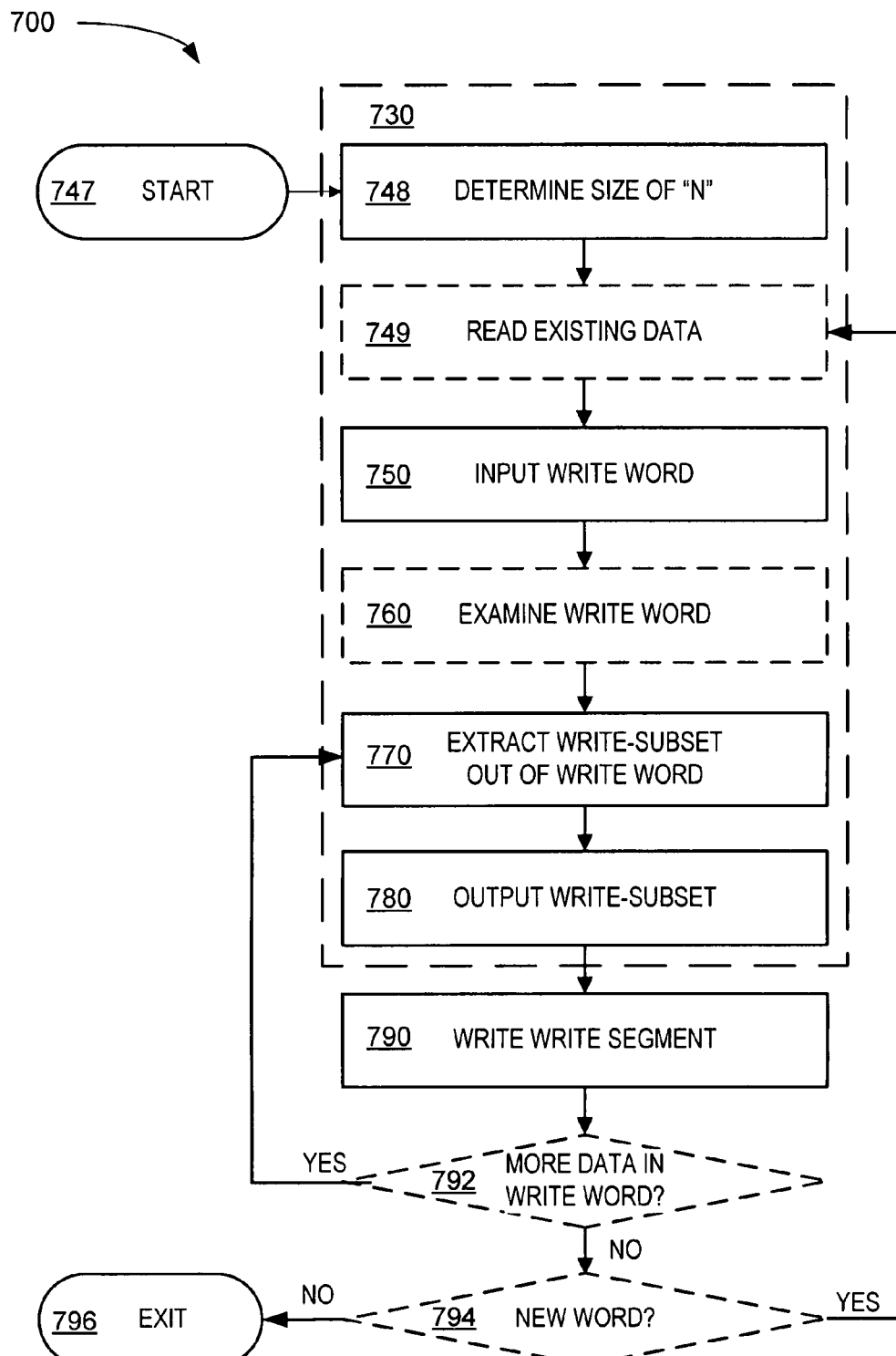
FIG. 7 is a flowchart illustrating adaptive programming methods of a memory circuit according to embodiments of the present disclosure.
Figure 8:
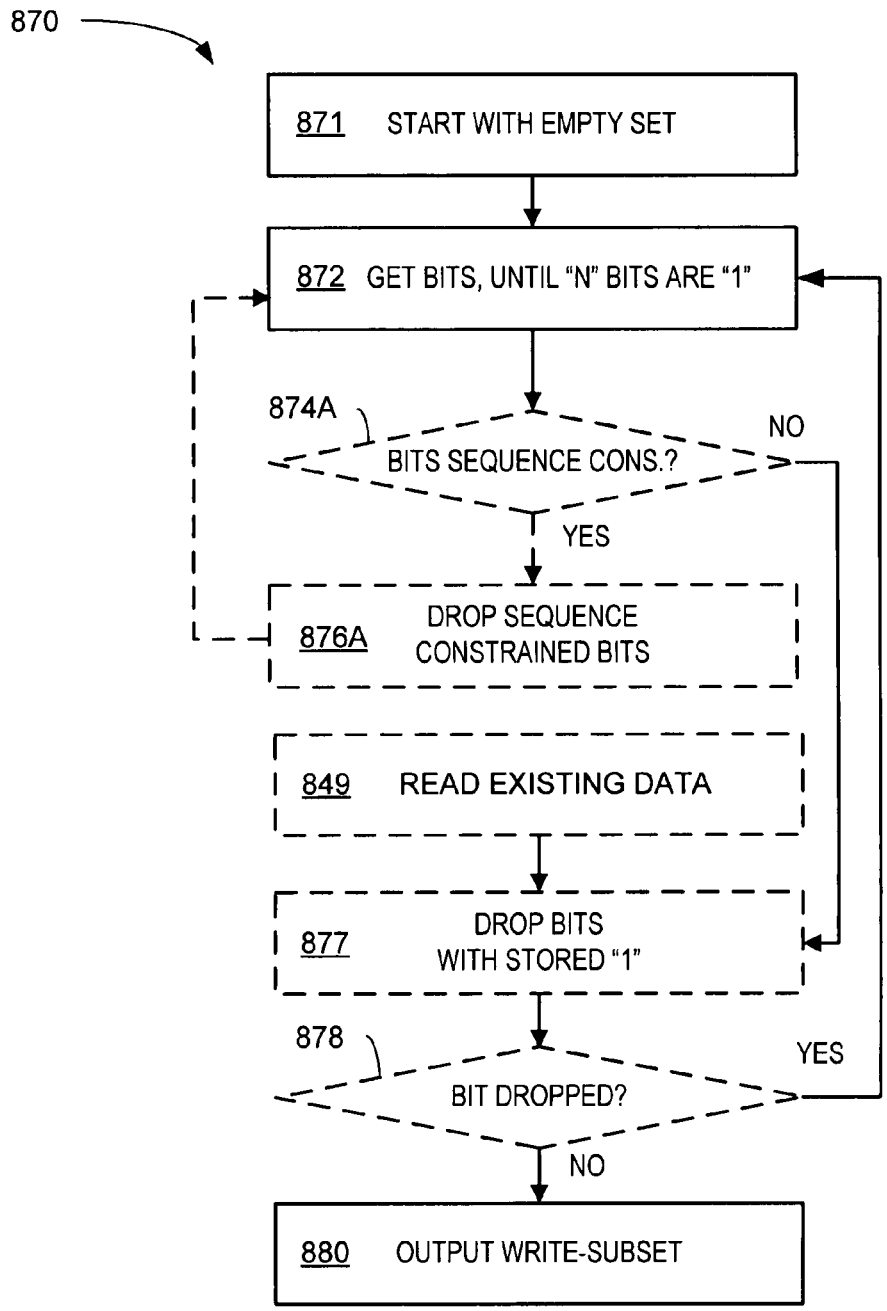
FIG. 8 is a flowchart illustrating a method of extracting a write-subset from a write word according to an embodiment of an operation of FIG. 7.
Figure 10:
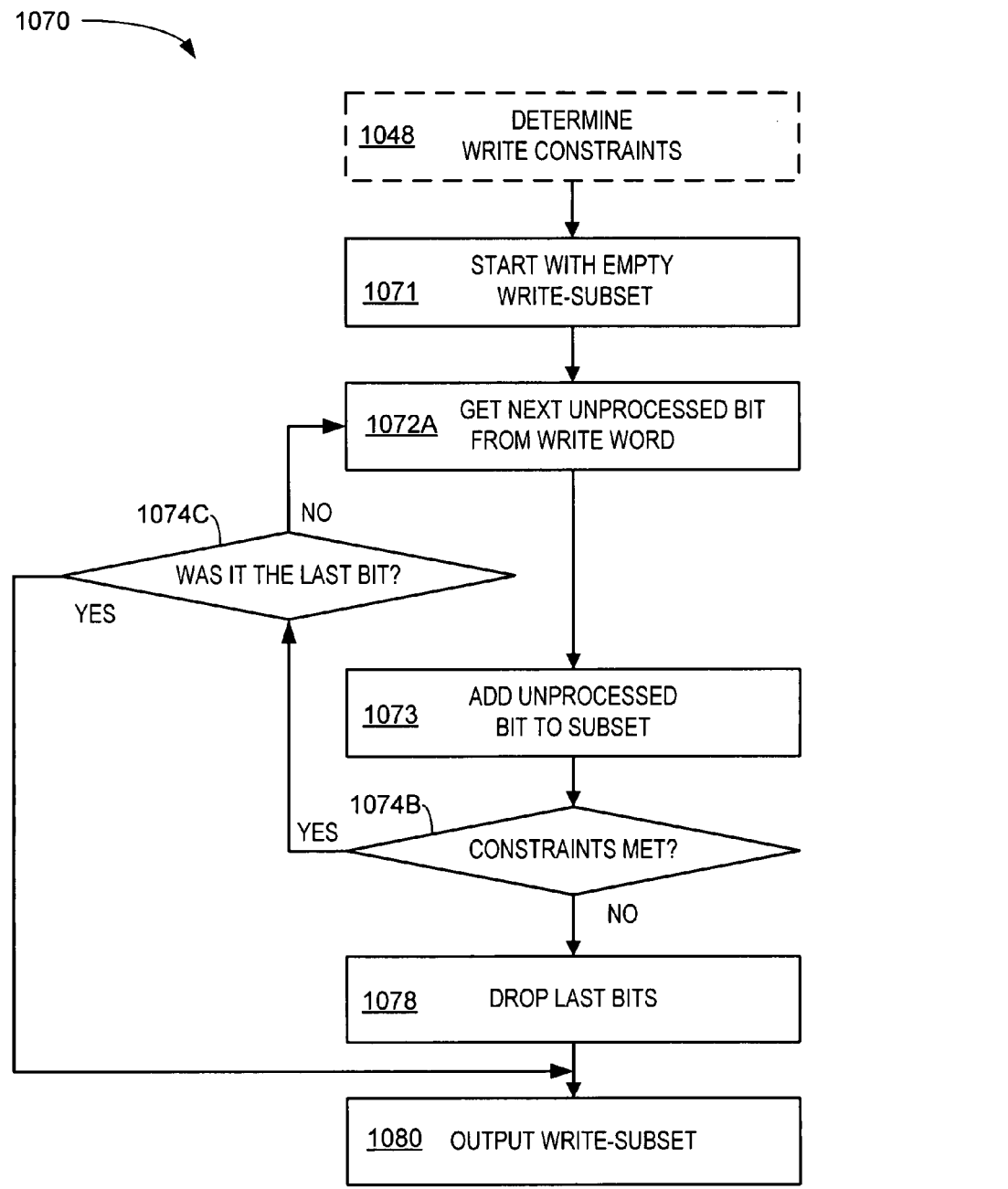
FIG. 10 is a flowchart illustrating another method of extracting a write-subset from a write word according to an embodiment of an operation of FIG. 7.

FIG. 7 is a flowchart illustrating adaptive programming methods 700 of memory circuit 210. Method 700 starts in action 747. Block 730 shows sequence of actions taken to generate a write-subset. In action 748, segment size of "N" is determined as shown in FIG. 6. In optional action 749, existing data of the target memory cells are read. Using this information can allow skipping of cells that already having logic "1" stored. In action 750, write word is imputed. In optional action 760, write word is examined for its contents. In action 770, a write-subset is extracted out of a write word. There are a number of ways to extract a write-subset. As mention earlier, the simplest way to partition a word is to break it down to single bits. More optimal methods for write-subset extraction are shown in FIG. 8 and FIG. 10. These methods are capable of producing shorter programming cycles. In action 780, the extracted write-subset is outputted. In action 790, the outputted write-segment is written into memory of FIG. 2. In action 792, if it is determined that there are more data in write word the method loops back to action 770 to extract the next subset. If there is no more un-processed data in the write word, in action 794 it is determined if more words need to be written. When there are more words to be written the method loops back to action 749, otherwise the method exits in step 796.

FIG. 8 shows a flowchart, illustrating method 870 for extracting a write-subset from a write word according to an embodiment of an operation of FIG. 7. Method 870 starts at action 871, when write-subset is cleared. In action 872, the leftmost N unprocessed logic "1" bits of the write word are added to the write-subset. At this time, the extraction can be considered complete and the method can proceed to action 880 where the write-subset is outputted. Executing optional steps 874A through 878 can further shorten the programming cycle. In optional action 774A, if it is determined that the generated subset contains constrained bits, the constrained bits are dropped from the subset in action 876A; otherwise the method continues in action 877. After dropping the constrained bits, method 870 loops back to action 872. In action 849 existing data of the target memory cells are read. In action 877, the read data is compared with the write data. For cells that already have the intended logic "1" stored no additional programming is needed, they can be skipped, and their bit can be dropped from the write-subset. In action 878, if it is determined that a bit is dropped, method 870 loops back to action 872 to obtain an additional bit, otherwise in action 780, the extracted write-subset is outputted.

FIGS. 9A-9C are tables showing variable length segmentations of the write word of FIG. 3. The illustrated example shows the result of the variable length segmentation method where "N" was selected based on the charge pump drive capability and no other considerations are taken into account.

FIG. 9A is a table showing a variable length segmentation where value of "N" is chosen to be 2. The generated subsets' lengths are varied from two bits of subset 5 to seven bits of subset 6.

FIG. 9B is a table showing another variable length segmentation, the example shows the result where value of "N" is chosen to be 8. The generated subsets' lengths are twenty bits for subset 1 and twelve bits for subset 2.

FIG. 9C is a table showing actual bits of data that are written in the memory circuit using segmentation as shown in FIG. 9B. It should be noted, only cells storing logic "1" are programmed.

FIG. 10 is a flowchart illustrating method 1070 of extracting a write-subset from a write word according to an embodiment of an operation of FIG. 7. Method 1070 starts at optional action 1048, where write constraints are determined. Write constraints determination can follow the steps described in FIG. 6. In addition, constrains like a write sequence constraint and voltage constraint can be considered. Write sequence constraint prohibits certain cells to be programmed in the same program cycle. In action 1071, the write-subset is cleared. In action 1072A, the leftmost unprocessed logic "1" bit is fetched from the write word. In action 1073, the newly fetched bit is added to the write-subset. In action 1074B, if it is determined that the subset still meets existing constraints, method 1070 continues in action 1074C, otherwise last fetched bit is dropped in action 1078. In action 1074, if it is determined that bit processed is the last bit from the write word, the subset is outputted in action 1080, otherwise method 1070 loops back in action 1072A and fetches the leftmost unprocessed logic "1" bit from the write word.

FIG. 11A is a table showing a sample of variable length segmentation of the write word of FIG. 3. The write-subset extraction is performed by method 1070. Subset 1 shows two sequence constrained bits; one of the bits is dropped from subset 1 and moved to subset 2. Subset 2 shows a voltage constrained bit, which requires having this bit moved to subset 3.

FIG. 11B is a table showing actual bits of data that are written in the memory circuit using segmentation per FIG. 11A according to an embodiment of the present disclosure.

Numerous details have been set forth in this description, which is to be taken as a whole, to provide a more thorough understanding of the invention. In other instances, well-known features have not been described in detail, so as to not obscure unnecessarily the invention.

The invention includes combinations and subcombinations of the various elements, features, functions, and/or properties disclosed herein. The following claims define certain combinations and subcombinations, which are regarded as novel and non-obvious. Additional claims for other combinations and subcombinations of features, functions, elements, and/or properties may be presented in this or a related document.

The invention claimed is:

1. A memory circuit, comprising:
   cells for storing data;
   an input for receiving a word of data to be stored; and a digital controller for parsing the word into a plurality of write-subsets, a certain one of the write-subsets having a size depending on values of the data of the certain write-subset, wherein each datum has a value selected from one of 0 and 1, wherein the size of the write-subset is characterized by an operative number (N) of data bits having a value of 1, wherein at least two of the write-subsets have the same N, and wherein the two write-subsets with the same N are further of unequal length.

2. The memory circuit of claim 1, wherein the memory circuit is a Non-Volatile Memory (NVM) circuit.

3. The memory circuit of claim 1, wherein the memory circuit is a volatile memory circuit.

4. The memory circuit of claim 1, wherein the size of the write-subset further depends on a constraint that is specific to the memory circuit.

5. The memory circuit of claim 1, wherein some of the received data are not stored.

6. The memory circuit of claim 1, wherein N equals 1.

7. The memory circuit of claim 1, wherein the controller further determines N from a physical constraint.

8. The memory circuit of claim 7, wherein the physical constraint relates to an operating temperature of the memory circuit.

9. The memory circuit of claim 7, wherein the physical constraint relates to a supply voltage of the memory circuit.

10. The memory circuit of claim 7, wherein the physical constraint is at least one of memory circuit specific constraints selected from a group including a charge pump capacity, a row size, and a cost of writing "0".

11. The memory circuit of claim 10, wherein the circuit specific constraint is obtained from architectural configuration data of the memory circuit.

12. The memory circuit of claim 11, wherein the architectural configuration data is stored in specific ones of the cells.

13. The memory circuit of claim 1, wherein the controller further adjusts one of the write-subsets to overcome a constraint, prior to writing.

14. The memory circuit of claim 13, wherein adjusting is performed so as to skip cells where a value of 1 is already stored.

15. The memory circuit of claim 13, wherein adjusting is performed so as to move at least one data bit that causes a sequence constraint violation to a different write-subset.

16. The memory circuit of claim 1, wherein the digital controller includes a sequence controller and a subset pointer.

17. A host device, comprising:
an operative circuit; and
a memory circuit, comprising:
cells for storing data for use by the operative circuit;
an input for receiving a word of data to be stored; and
a digital controller for parsing the word into a plurality of write-subsets, a certain one of the write-subsets having a size depending on values of the data of the certain write-subset,
wherein each datum has a value selected from one of 0 and 1,
wherein the size of the write-subset is characterized by an operative number (N) of data bits having a value of 1,
wherein at least two of the write-subsets have the same N, and wherein the two write-subsets with the same N are further of unequal length.

18. The host device of claim 17, wherein the memory circuit is a Non-Volatile Memory (NVM) circuit.

19. The host device of claim 17, wherein the memory circuit is a volatile memory circuit.

20. The host device of claim 17, wherein the digital controller includes a sequence controller and a subset pointer.

* * * * *